United States Patent

Fuchita

[19]

[11] Patent Number: 5,837,316
[45] Date of Patent: Nov. 17, 1998

[54] ULTRA FINE PARTICLE GAS DEPOSITION APPARATUS

[75] Inventor: Eiji Fuchita, Narita, Japan

[73] Assignee: Vacuum Metallurgical Co., Ltd., Chiba-Ken, Japan

[21] Appl. No.: 580,143

[22] Filed: Dec. 28, 1995

Related U.S. Application Data

[63] Continuation of Ser. No. 351,701, Dec. 8, 1994, Pat. No. 5,536,324.

[30] Foreign Application Priority Data

Dec. 10, 1993 [JP] Japan ................................... 5-341484

[51] Int. Cl.[6] .............................. B05D 3/02; B05D 3/08; B05D 3/10; C23C 16/00
[52] U.S. Cl. ......................... 427/191; 427/192; 427/250; 118/726
[58] Field of Search ................................ 427/180, 248.1, 427/255, 255.1, 255.2, 191, 192, 250; 118/726

[56] References Cited

U.S. PATENT DOCUMENTS

4,725,456  2/1988  Watanabe et al. ............... 827/255.2 X
5,186,120  2/1993  Ohnishi et al. .......................... 118/667
5,186,872  2/1993  Nishiwaki et al. ................. 427/180 X
5,536,324  7/1996  Fuchita .................................... 118/726

*Primary Examiner*—Michael Lusiugnan
*Attorney, Agent, or Firm*—Rudnick & Wolfe

[57] ABSTRACT

In a gas deposition apparatus includes: an ultra fine particle evaporation chamber; an evaporation source arranged in the ultra fine particle evaporation chamber; a deposition chamber; a substrate arranged in the deposition chamber; a transfer pipe connecting the ultra fine particle evaporation chamber with the deposition chamber; an inlet port of the transfer pipe directly facing to the evaporation source in the ultra fine particle evaporation chamber and an outlet port of the transfer pipe being in the deposition chamber; a nozzle connected to the outlet port of the transfer pipe, facing to the substrate in the deposition chamber; and an introducing port for introducing inert gas into the ultra fine particle evaporation chamber wherein ultra fine particles evaporated from the evaporation source by heating the latter, are transported together with inert gas through the transfer pipe and they are ejected out from the nozzle onto the substrate to form a film or condensation of ultra fine particle thereon, a DC power source is connected to the transfer pipe and the seethe heater is wound on the nozzle.

3 Claims, 7 Drawing Sheets

ULTRA FINE PARTICLE GAS DEPOSITION APPARATUS

This is a continuation of application Ser. No. 08/351,701, filed Dec. 8, 1994, now U.S. Pat. No. 5,536,324.

BACKGROUND OF THE INVENTION

1. Field of the Invention:

This invention relates to a gas deposition apparatus, and more particularly to a gas deposition apparatus in which ultra fine particles are transported with an inert gas, and are ejected at a high speed from a nozzle onto a substrate positioned in direct facing relationship to the nozzle to form a thick film or condensate of the ultra fine particles on the substrate.

2. Description of the Prior Art:

A new maskless film-making method using ultra fine particles has been established, named the gas deposition method. This method has the following characteristics compared with conventional methods: 1) Dry processing; 2) Direct write processing, maskless (50 µm width); 3) High deposition rate processing (~100 µm/sec), and 4) Low temperature processing (250° C.).

Ultra fine particles (UFP) of organic and inorganic materials can be formed by the gas evaporation method (gas condensation method). In the gas deposition method, particles formed by the gas evaporation method in an evaporation chamber are carried to another chamber (the deposition chamber) through a pipe. Particles are accelerated in the pipe with a gas flow and come out of a nozzle located in the deposition chamber. This chamber is evacuated down to less than $10^3$ Pa, and the particles are deposited on a substrate to form UFP films. The speed of the particles as they exit the nozzle depends on the pressure difference between the evaporation chamber and the deposition chamber.

The particles speed exceeds 500 m/s and adhesion strengths of the films reach 20 kgf/mm$^2$ which is comparable to electroplating films. This is achieved where the pressure of the evaporation chamber is at 2 atms, and the temperature of a Ni substrate is 200° C. Patterns of spots and lines with 50 µm size and also wider films can be formed on a substrate without a masking system. The deposition rate can exceed 100 µm/sec using a nozzle with an inner diameter of 600 µm.

Generally, ultra fine particles are formed by the gas evaporation method. In the gas evaporation method, metal atoms are evaporated in an inert gas such as helium or argon, collided with gas atoms and cooled, thereby condensing into particles. The particles sizes are controlled by changing the evaporation temperature or the gas pressure. Larger sized particles can be formed under the conditions of higher temperature or higher pressures.

The formed particles by the gas evaporation method are carried to another chamber through a pipe while in an aerosol state. The particles are accelerated in the pipe and sprayed on a substrate through a narrow nozzle and deposited on the substrate in the form of a UFP film. This method is called the gas deposition method. As for materials and forms of substrates, there are no restrictions; glass, ceramics, etc., can be used.

This method is expected to be used for forming electronic conductive films, resistive films, and dielectric films for hybrid microelectronics because it has several advantages over conventional methods including direct write processing, low temperature processing, and the ability to form uniformly mixed UFP films using more than two elements.

Figure 1:
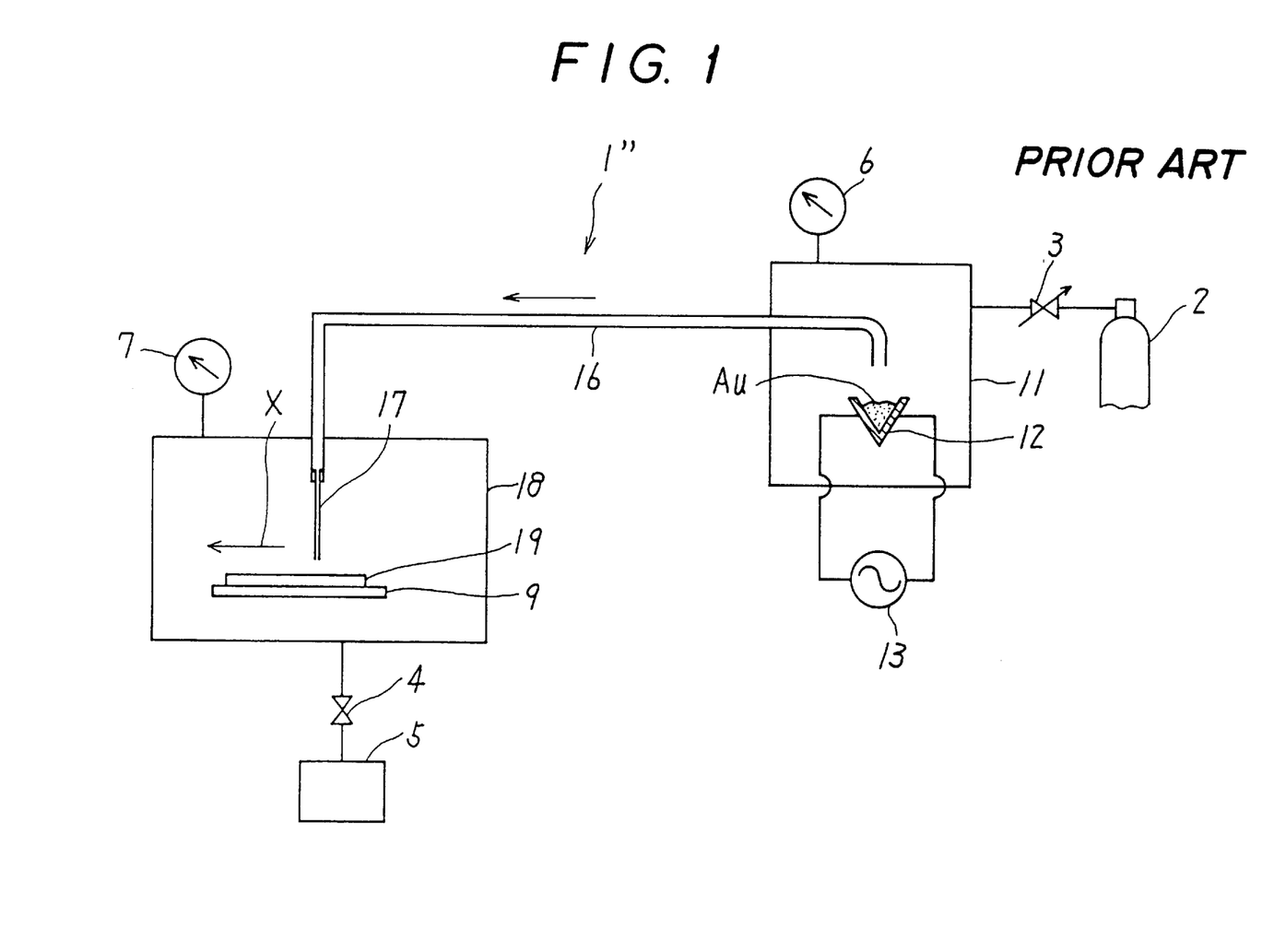
FIG. 1 is a schematic view of a gas deposition apparatus of the prior art.

The schematic diagram of the gas deposition apparatus of the prior art is shown in FIG. 1. The gas deposition apparatus 1" is mainly composed of a UFP evaporation chamber 11, a deposition chamber (a spray chamber) 18, a transfer pipe 16, and a gas circulation system. The chambers to which pressure gauge 6 and 7 are attached, respectively, are evacuated down to $10^{-4}$ Pa, and then helium gas is supplied through a variable flow valve 3 from a bottle 2. The gas is carried to the deposition chamber 18 through the transfer pipe 16. The gas pressure of the evaporation chamber 11 is controlled from 1 atm to 4 atms by changing the helium gas supplying speed and the gas pumping speed.

Metal atoms are evaporated from a crucible which, for example, contains Au (gold). The crucible is resistance heated by an alternating current (AC) power source 13. Evaporated atoms colliding with gas atoms are cooled, condensing into particles.

In the case of Au film formation, the evaporation temperature is controlled at between 1500° C. and 1700° C. In the case of Ag film formation, the evaporation temperature is controlled at between 1300° C. and 1500° C. In the case of Cu and Pd film formation, the evaporation temperature is controlled at between 1450° C. and 1550° C., respectively.

The condensed particles are carried through the transfer pipe 16 with the gas flow as shown by the arrow. The particles carried through the transfer pipe 16 are ejected out of the nozzle 17 in the deposition chamber 18 and deposited on a substrate 19. The deposition chamber 18 is pumped down to less than $10^3$ Pa through a vacuum valve 4 by a pump system 5 of a mechanical booster pump and a rotary pump.

A substrate holder 9 is designed to be moved along the X direction as shown in FIG. 1, and in the Y direction and the Z direction making right angles with each other, by a digital programmable controller. The scanning speed of the substrate 19 is controlled between 0.01 mm/sec and 2 mm/sec.

Using the controller, a desired pattern of UFP can be formed on the substrate 19. When the substrate 19 is not moved, a pillared condensate of UFP is formed on the substrate 19.

The thick film formed by the gas deposition method consists only of Au, and so it has the advantage that it does not include a high polymer binder, in contrast to other prior art methods.

However, this gas deposition method of the prior art has still the following problems: Aggregates of ultra fine particles are apt to be included in the film, resulting in deterioration of film characteristics and lowering of adhesion strength between the film and the substrate. The nozzle is also sometimes clogged with aggregates. Furthermore, the time during which a good film can be stably obtained is short.

SUMMARY OF THE INVENTION

Accordingly, it is an object of this invention to provide a gas deposition apparatus in which a good film of UFP, including no aggregation of UFP, can be securely and stably obtained for a long time.

In accordance with an aspect of this invention, a gas deposition apparatus includes:

(A) an ultra fine particle evaporation chamber;
(B) an evaporation source arranged in said ultra fine particle evaporation chamber;
(C) a deposition chamber;
(D) a substrate arranged in said deposition chamber;

(E) a transfer pipe connecting said ultra fine particle evaporation chamber with said deposition chamber, the transfer pipe having an inlet port of said transfer pipe positioned in direct facing relationship to said evaporation source in said ultra fine evaporation particle chamber, and an outlet port of said transfer pipe being in said deposition chamber;

(F) a nozzle connected to said outlet port of said transfer pipe, in facing relationship to said substrate in said deposition chamber; and (G) an introducing port for introducing inert gas into said ultra fine evaporation particle chamber wherein ultra fine particles evaporated from said evaporation source by heating the latter, are transported together with inert gas through said transfer pipe and are ejected out from said nozzle onto said substrate to form a film or condensate of ultra fine particles thereon.

The improvement of the invention relates to this gas deposition apparatus with a heating means arranged on said transfer pipe, or on said transfer pipe and said nozzle.

The foregoing and other objects, features, and advantages of the present invention will be more readily understood upon consideration of the following detailed description of the preferred embodiment of the invention, taken in conjunction with the accompanying drawings.

DESCRIPTION OF THE PREFERRED EMBODIMENTS

Next, a gas deposition apparatus according to a first embodiment of this invention will be described with reference to the drawings.

Figure 2:
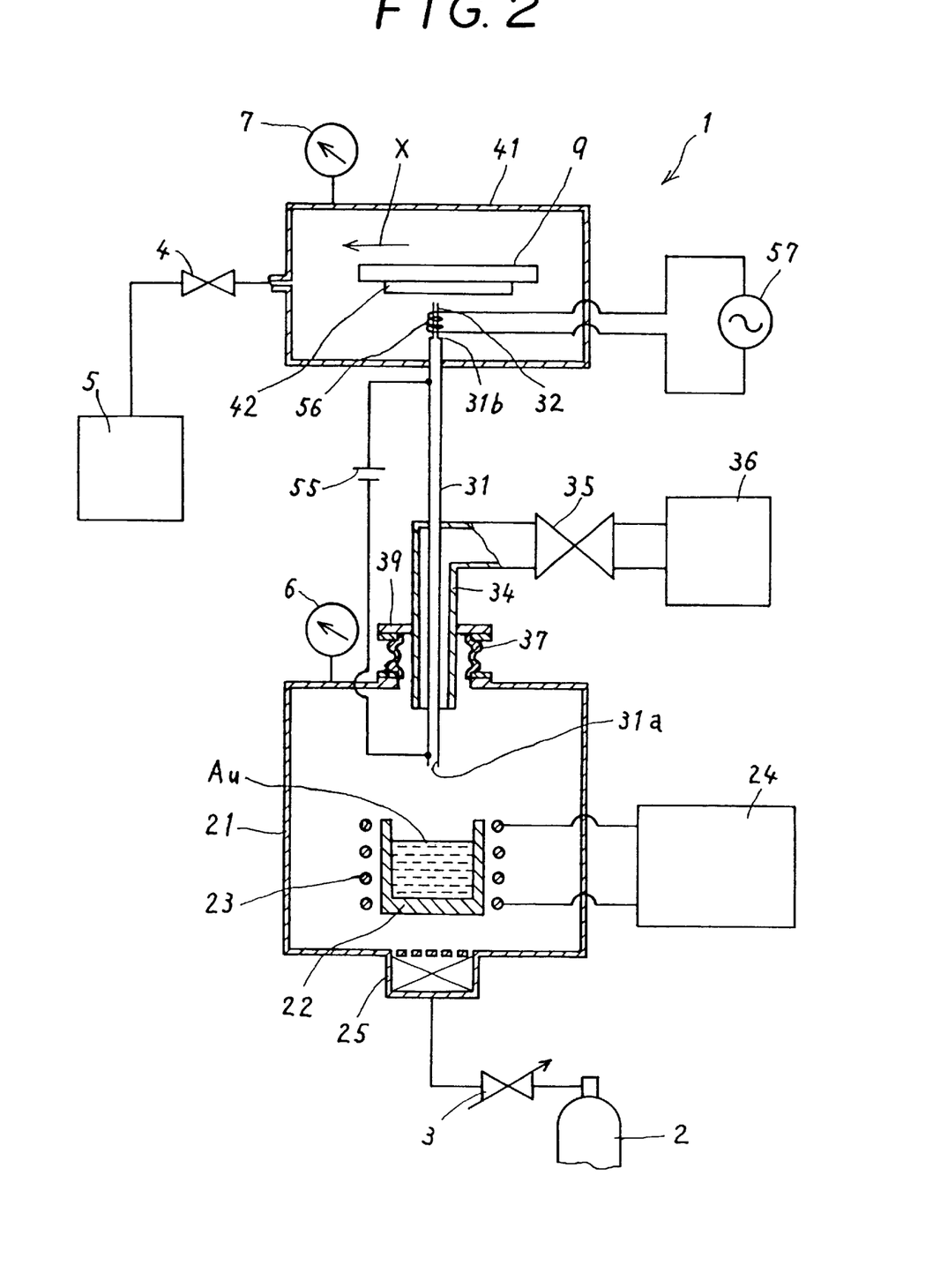
FIG. 2 is a schematic view of a gas deposition apparatus according to a first embodiment of this invention.

FIG. 2 shows a gas deposition apparatus 1 of the first embodiment. Generally, it consists of an ultra fine particle evaporation chamber 21, a transfer pipe 31, and a deposition chamber 41. These are arranged in a vertical direction.

A carbon crucible 22, the inner diameter of which is equal to 5.0 mm, is arranged in the ultra fine particle evaporation chamber 21. Evaporation material consisting of Au is contained in the carbon crucible 22. An electromagnetic coil 23 for heating inductively the carbon crucible 22 is wound around the carbon crucible 22. The coil 23 is connected to a radio (high) frequency electric power source 24 which is arranged outside of the ultra fine particle evaporation chamber 21.

The reason why the carbon crucible 22 containing Au material, as an evaporation source, is heated by the induction heating method, not the resistance heating method, is as follows. If, for example, a tungsten crucible is used for the resistance heating method, only the crucible is directly heated by the Joule heating. The Au is then melted by transmitting heat from the crucible. The molten Au is whirred in the crucible, but the heating is not uniform, and the resulting ultra fine particle grain size distribution is wide.

On the other hand, Au in the carbon crucible 22 is heated by the induction heating method. Eddy currents are generated in the molten Au and eddy current loss heats the Au. The Au is thereby uniformly heated in contrast to the resistance heating method, and the produced ultra fine particle grain size distribution is narrow.

Helium (He) gas is introduced into the ultra fine particle evaporation chamber 21 through a mesh-filter type introducing port 25, so that the ultra fine particle evaporation chamber 21 is maintained at a predetermined pressure. The helium gas is used for transporting the produced ultra fine particles. The mesh-filter type introducing port 25 is of the type in which the area of the filter and the aperture ratio can be changed. The helium gas flows through a variable flow valve 3 from a bottle 2, and the gas flow is introduced into the ultra fine particle evaporation chamber 21 through the mesh-filter type introducing port 25 that adjusts the gas flow speed around the carbon crucible 22. A pressure gauge 6 is installed on the ultra fine particle evaporation chamber 21.

The transfer pipe 31 is straight in a vertical direction. The inner diameter of the transfer pipe 31 is equal to 4.3 mm. The lower end portion of the transfer pipe 31 is inserted into the ultra fine particle evaporation chamber 21. An inlet port 31a of the transfer pipe 31 is located directly above the carbon crucible 22. The distance between the opening of the carbon crucible 22 and the inlet port 31a of the transfer pipe 31 is equal to 30 mm. The top portion of the transfer pipe 31 is inserted into the deposition chamber 41. A nozzle 32 which ejects out ultra fine particles is connected to an outlet port 31b of the transfer pipe 31.

Figure 4:
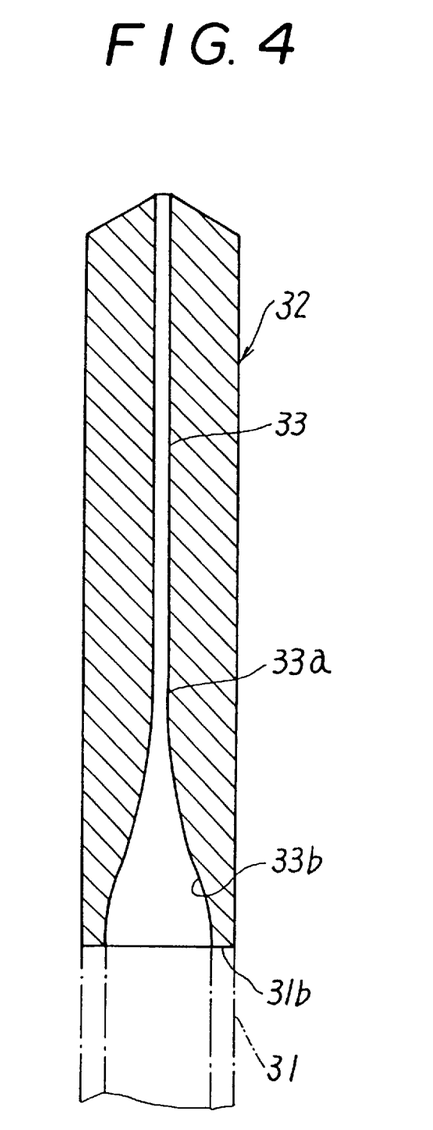
FIG. 4 is an enlarged cross-sectional view of a nozzle used in the above embodiments.

The nozzle 32 has a throat or narrow hole portion 33, the inner diameter of which is equal to 0.6 mm. As shown in FIG. 4, in the cross sectional view along the center line of the nozzle 32, the boundary 33b between the connection port (outlet port) 31b where the transfer pipe 31 is connected to the nozzle 32, and an inlet 33a of the throat hole portion 33, is shaped into a trochoid. Thus, there is no step in the connection part between the boundary 33b of the nozzle 32 and the hole of the transfer pipe 31. The transfer pipe 31 is straight without bending. Accordingly, turbulence does not occur in the transfer flow of the ultra fine particles through the transfer pipe 31.

Further, the transfer pipe 31 and the nozzle 32 are heated by the following method. As shown in FIG. 2, a DC source 55 is connected between the bottom portion and the top portion of the transfer pipe 31. The transfer pipe 31 is heated as a resistance body.

Figure 5:
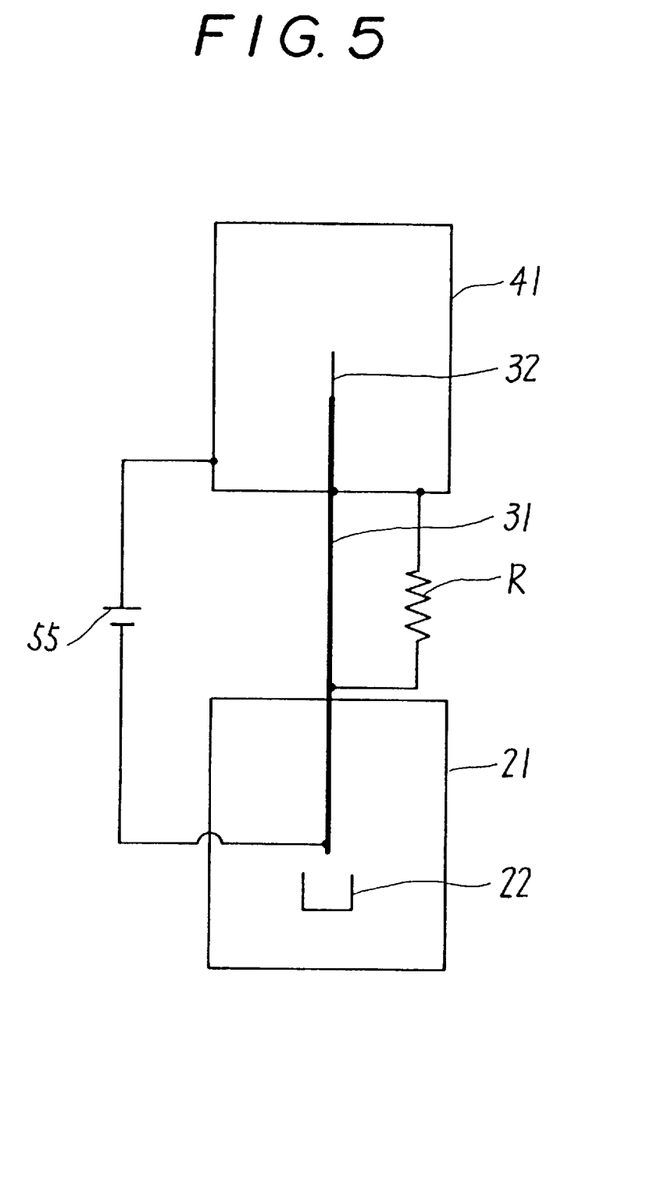
FIG. 5 is one modification of an electric circuit diagram for heating a transfer pipe in the above embodiments.
Figure 6:
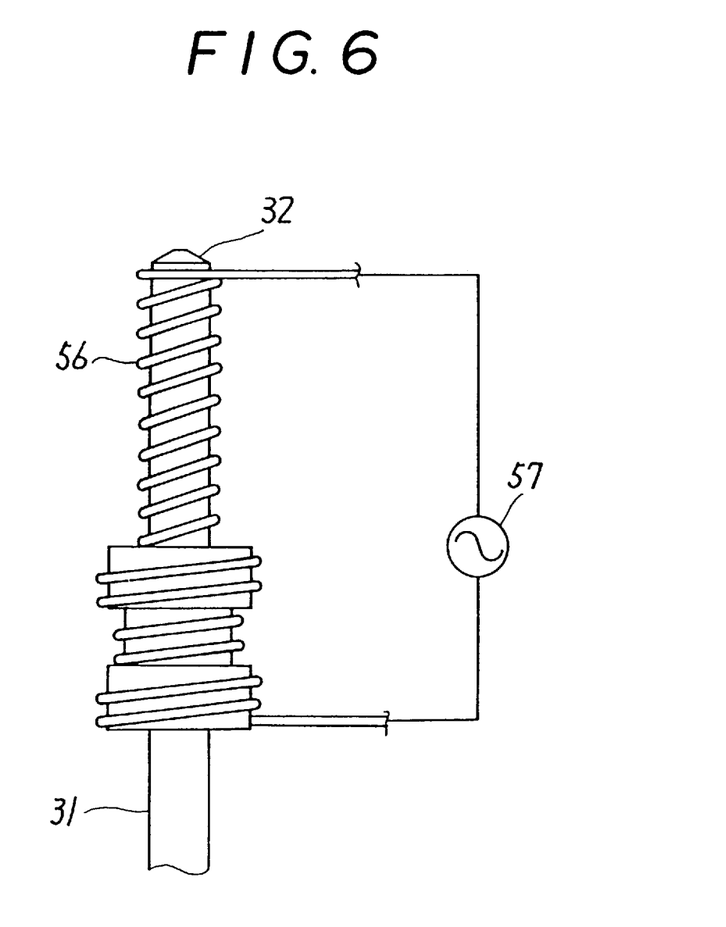
FIG. 6 is a schematic view of a seethe heater wound on the nozzle in the above embodiments.

FIG. 5 shows another electric connection method. The lower end of the transfer pipe 31 is connected to one electrode of the DC source 55. The deposition chamber 41 is connected to the earth. A resistance R is connected in parallel with the transfer pipe 31. The resistance R is connected to the exposed portion of the transfer pipe 31 at the side of the ultra fine particle evaporation chamber 21, and to the deposition chamber 41. The transfer pipe 31 can be heated with a gradient of temperature along the axis of the transfer pipe 31. Further, as shown in FIG. 6, a seethe heater 56 is wound on the nozzle 32. The seethe heater 56 is connected to another AC power source 57.

Referring to FIG. 2, an inhalant or evacuation pipe 34, which is concentric with the transfer pipe 31, is located above the inlet 31a of the transfer pipe 31, in the ultra fine particle evaporation chamber 21, so that an annular space is formed between the transfer pipe 31 and the inhalant pipe 34. The inhalant pipe 34 is so arranged that it sucks in ultra fine particles drifting around the carbon crucible 22 in the ultra fine particle evaporation chamber 21. The inhalant pipe 34 is bent away from the transfer pipe 31 outside of the ultra fine particle evaporation chamber 21. It is connected to a vacuum pump 36 through a vacuum valve 35.

Figure 7:
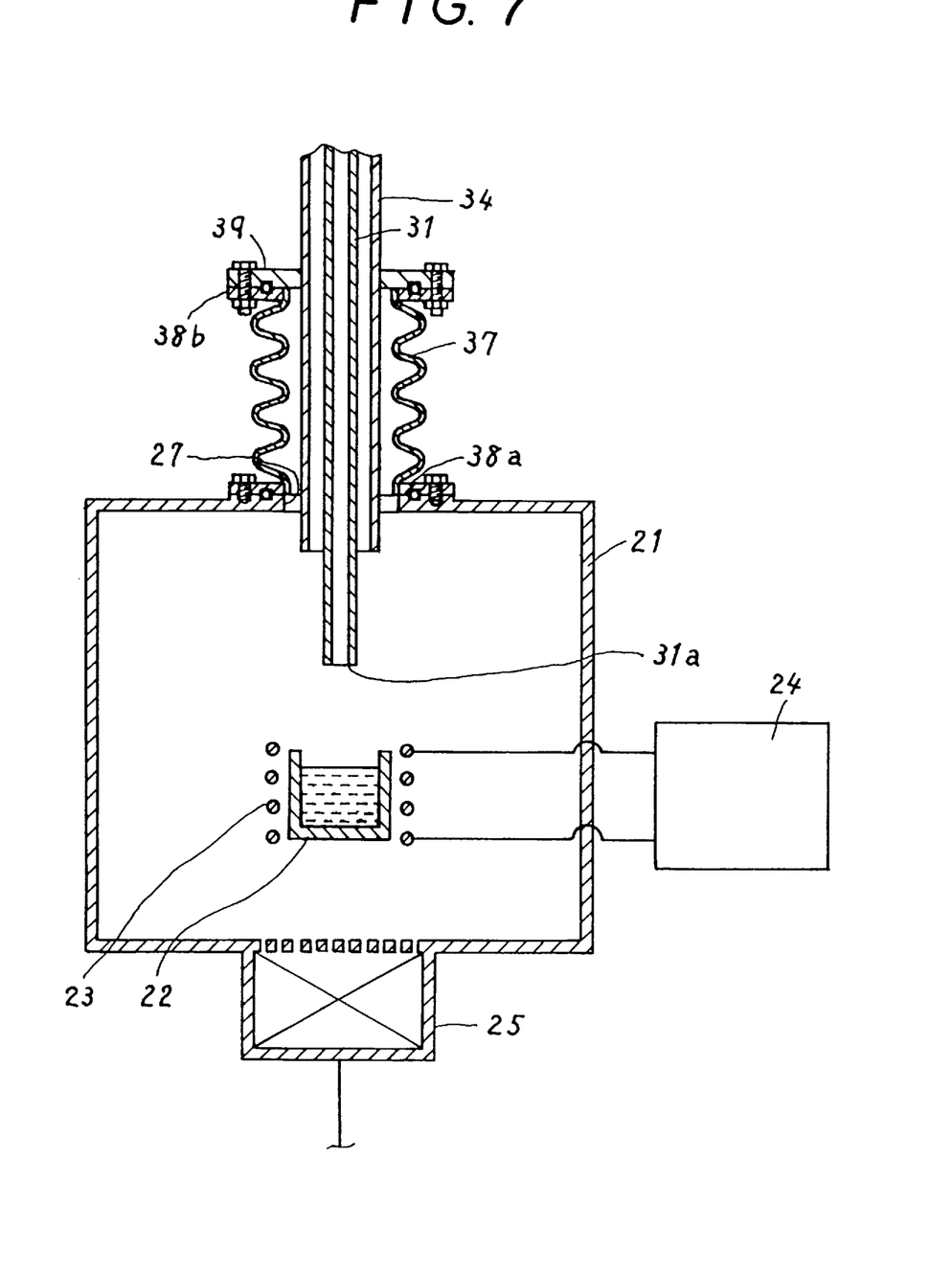
FIG. 7 is a schematic view of a vacuum connection where a transfer pipe and an inhalant pipe are connected to an ultra fine particle evaporation chamber, using a metal bellows.

A vacuum connecting portion, through which a double pipe consisting of the transfer pipe 31 and the inhalant pipe 34 is inserted into the ultra fine particle evaporation chamber 21, consists of a metal bellows 37, as shown clearly in FIG. 7. A flange 38a is fixed at one end of the metal bellows 37, and is located at the opening 27 of the wall of the ultra fine particle evaporation chamber 21. Another flange 38b is fixed to another end of the metal bellows 37. A flange 39 is fixed to the inhalant pipe 34. Therefore, the double pipe, that is, the transfer pipe 31 and inhalant pipe 34, can be somewhat inclined in order that the position of the inlet port 31a of the transfer pipe 31 may be adjusted relative to the carbon crucible 22.

Referring to FIG. 2 again, a Ni/Ti/Si (in order of the level) wafer substrate 42 is arranged in the deposition chamber 41, and makes a right angle with the nozzle 32. The distance between the nozzle 32 and wafer substrate 42 is equal to 2 mm. The Ni surface is nearest to the nozzle 32, that is, it is directly facing to the nozzle 32. The substrate 42 is supported on the operating plate 9 which is movable in the X direction, the Y direction, and the Z direction at right angles with each other, as shown by the arrow. And the operating plate 9 has a heating mechanism (which is not shown) for heating the substrate 42. The deposition chamber 41 is connected to a vacuum pump 5 through a vacuum valve 4. Further, a vacuum gauge 7 is attached to the deposition chamber 41.

There has been described an arrangement of the first embodiment. Next, there will be described operations of this embodiment.

In FIG. 2, the vacuum valve 4 is opened, and the deposition chamber 41 is evacuated by the vacuum pump 5. At the same time, the vacuum valve 35 is opened, and the ultra fine particle evaporation chamber 21 is evacuated by the vacuum pump 36 through the inhalant pipe 34 and the vacuum valve 35. On the other hand, the variable flow valve 3 is opened, and helium gas is introduced into the ultra fine particle evaporation chamber 21 through the mesh-filter type introducing port 25 so as to maintain the pressure of 2 atm. The aperture ratio of the mesh-filter is equal to 50% and the area of the mesh-filter is equal to 85 cm². So, the flow rate of the helium gas is equal to 40 SLM (liters in normalized condition per minute) at the mesh-filter type introducing port 25, and the flow speed of the gas near the evaporation source 22 is equal to about 0.2 m/sec.

About one quarter of the He-gas (which is equal to 10 SLM) which is introduced into the chamber 21, is transported through the transfer pipe 31, and is ejected from the nozzle 32. And about three quarters of this gas (which is equal to 30 SLM) is sucked from the inhalant pipe 34 and is discharged outside. The reason why the amount of the helium gas into the inhalant pipe 34 is larger, is as follows: While the ultra fine particles are produced at a stationary state, some of ultra fine particles are not sucked from the transfer pipe 31, and those are drifting around the carbon crucible 22 in the ultra fine particle evaporation chamber 21. Some of them are changed into aggregates of the particles during drifting in the ultra fine particle evaporation chamber 21, and if they are sucked into the transfer pipe 31, it has an adverse effect on the formed films on the substrate 42. Accordingly, it is necessary to discharge the particles as soon as possible.

Under this condition, the vacuum gauge 7 indicates a pressure of 0.3 Torr in the deposition chamber 41, and a differential pressure of about 2 atm is maintained between the ultra fine particle evaporation chamber 21 and the deposition chamber 41.

Further, electric power is supplied to the seethe heater 56 wound on the nozzle 32. The transfer pipe 31 which is connected to the nozzle 32 is heated, also. The temperature near the inlet port 31a of the transfer pipe 31 is about 300° C., and it is about 500° C. at the nozzle 32. Accordingly, a temperature gradient is obtained in the transfer pipe 31 and the nozzle 32. The temperature is controlled in the above mentioned manner, and the substrate 42 is heated at the temperature of 200° C. Next, the carbon crucible 22 which contains 5 gram of Au, is inductively heated to the temperature of about 1500° C. by the high frequency electric power of 150 kHz. Then the Au is molten and is evaporated from the carbon crucible 22. The atmosphere is the helium gas under the pressure 2 atm. Accordingly, the evaporation of Au is changed into ultra fine particles.

The produced ultra fine particles flow upwards from the opening of the carbon crucible 22. They are sucked into the inlet port 31a of the transfer pipe 31 by the differential pressure of 2 atm. Since the gas flow speed of the helium gas around the Au within crucible 22 is equal to 0.2 m/sec, the flow of the evaporation of the ultra fine particles is not disturbed, and it is stably sucked into the inlet port 31a of the transfer pipe 31.

At this time, by operating the transfer pipe 31 which can be inclined by the metal bellows 37, the position of inlet port 31a of the transfer pipe 31 relative to the carbon crucible 22 is adjusted, so that the transport amount of the ultra fine particles can be so controlled as to be maximum, that is, that the amount of the ultra fine particles which are not sucked into the transfer pipe 31 is so controlled as to be minimum. The reason why the relative position is adjusted, is that the amount of the transport through the transfer pipe 31 depends on the kind of the inert gas, the amount of the introducing gas, and the differential pressure between the ultra fine particle evaporation chamber 21 and the deposition chamber 41. Actually, the transfer amount of the ultra fine particles is measured by the deposition speed ($\mu$m/sec) while the substrate 42 is fixed in the deposition chamber 41.

Ultra fine particles of Au are sucked, along with the helium gas, into the transfer pipe 31 and are transported through the heated transfer pipe 31. The particles are ejected onto the surface of the substrate 42 which is heated to 200° C. from the heated nozzle 32 at high speed.

Under the above mentioned conditions, the operating plate 9 and accordingly the substrate 42 are moved in the X direction and the Y direction while the ultra fine particles of Au are ejected onto the substrate 42. The deposition of the film can be stably obtained at a predetermined rate of 60 $\mu$m/sec for ten hours. The grain size in the film is below the diameter of 0.1 $\mu$m and there are no aggregates in the film. This forms a film of Au on the Ni surface of the Ni/Ti/Si wafer material of the substrate 42.

In order to measure the adhesion strength between the Au film and Ni surface, the substrate 42 is fixed, and pillared condensates of the ultra fine particles are formed on the substrate 42. Then a force in the horizontal direction is applied to the film and thus, a shearing force measured as adhesion strength is obtained. The shearing force of 20 kgf/mm² is measured. Some destruction has occurred within the film of Au. The measured shearing force is further larger than the force of 10 kgf/mm² obtained by the gas deposition apparatus of the prior art.

Next, only the transfer pipe 31 is heated without heating the nozzle 32 so as to form a thick film of Au on the substrate 42. The film without aggregates has been formed continuously for 3 hours under the condition of a deposition rate below the 1 μm/sec. When, however, the deposition rate is higher than 1 μm/sec, it has been found out that aggregates are produced in the film after 30 minutes.

On the other hand, when both the transfer pipe 31 and the nozzle 32 are not heated, the aggregates of particles are produced in the film within 15 minutes even at the deposition rate of 0.5 μm/sec.

It is inferred that the above-mentioned result has been obtained for the following reason. The transfer pipe 31 and the nozzle 32 are heated. Accordingly, the helium gas as a carrier gas is heated near the inner wall of the transfer pipe 31 and the nozzle 32, and so the inner space becomes dust-free. The adherence of the ultra fine particles to the insides of the transfer pipe 31 and the nozzle 32 are suppressed, so aggregates cannot be produced. And no aggregates of particles are scattered from the inner wall. The film of Au without aggregates can be formed stably for a long time.

Further, the hole of the nozzle 32 is shaped into a trochoid at the inlet side, the connection part between the nozzle 32 and the transfer pipe 31 has no step in the inner walls, and the transfer pipe 31 is straight perpendicularly without a bent part. In other words, this gas deposition apparatus 1 is composed so as to be able to suppress the turbulence of the gas flow which contains the ultra fine particles, as much as possible. So, the adherence of the particles to the inner walls of the transfer pipe 31 and the nozzle 32 is suppressed.

Further, the arrangements of this embodiment are effective in the following points. The carbon crucible 22 is used, and it is heated by the high frequency induction heating method. The relative position of the inlet port 31a of the transfer pipe 31 to the carbon crucible 22 is adjusted. And, the ultra fine particles drifting in the ultra fine evaporation chamber 21 can be sucked into the inhalant pipe 34 as soon as possible.

Figure 3:
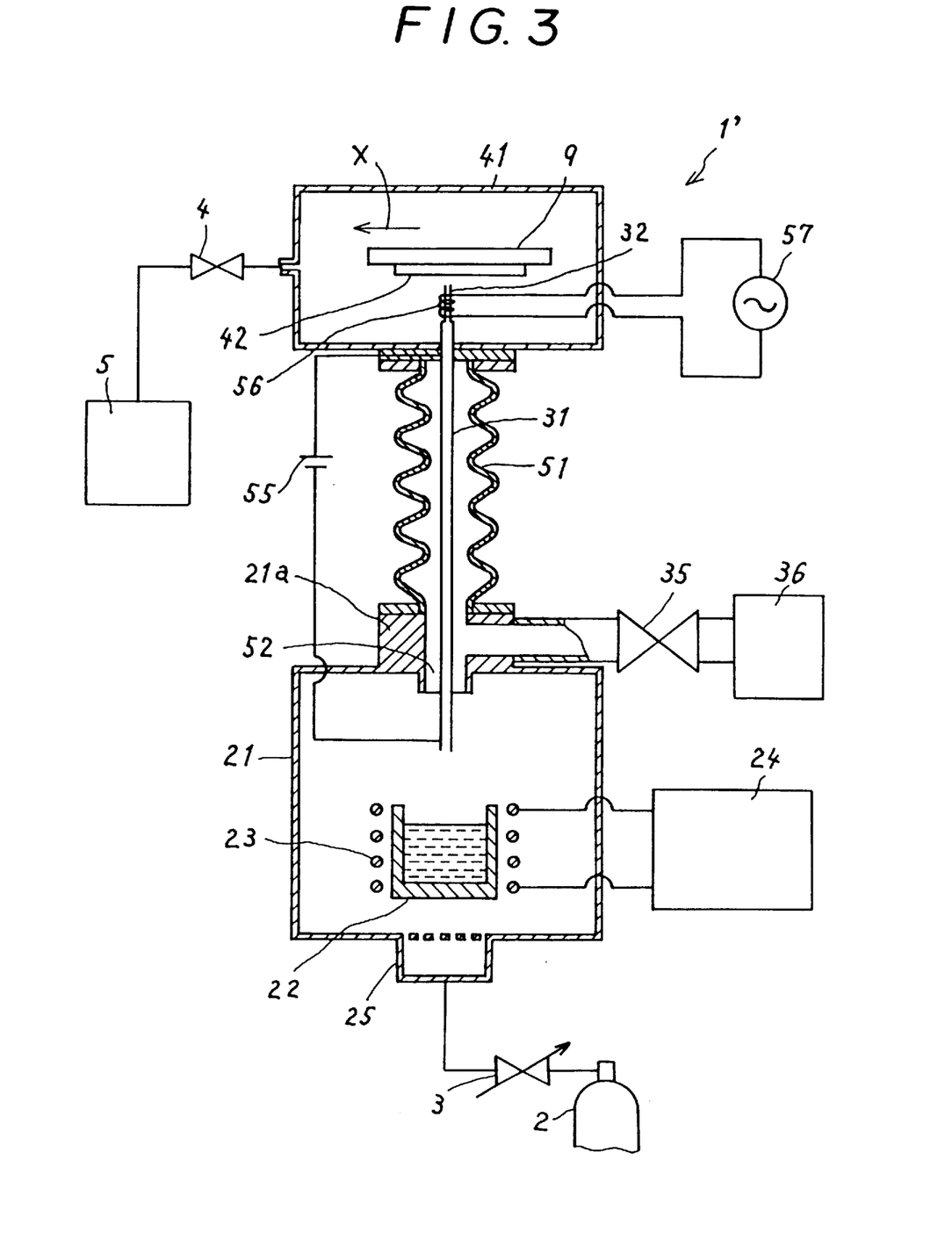
FIG. 3 is a schematic view of a gas deposition apparatus according to a second embodiment of this invention.

Next, a gas deposition apparatus of the second embodiment of this invention will be described with reference to FIG. 3, and it is denoted by the reference numeral 1'. Parts in FIG. 3 which correspond to those in FIG. 2, are denoted by the same reference numerals, and the description of these will be omitted.

The gas deposition apparatus 1' of the second embodiment is different from the gas deposition apparatus 1 of the first embodiment in the point that the transfer pipe 31 is covered with a metal bellows 51. Thus, the vacuum connecting part of the transfer pipe 31 is only at a wall portion of the deposition chamber 41. The wall of the ultra fine particle evaporation chamber 21 has an opening portion 52 through which the lower end portion of the transfer pipe 31 is inserted into the ultra fine particle evaporation chamber 21. The metal bellows 51 is fixed to the projection 21a of the chamber 21 at its lower end. Thus, the atmosphere and temperature of the interior of the metal bellows 51 can be the same as those of the ultra fine evaporation chamber 21. The transfer pipe 31 does not contact directly with the outer atmosphere. Accordingly, it is easy to heat the transfer pipe 31. And the vacuum connection portion of the transfer pipe 31 which is heated, is only one in the apparatus which is a part of the bottom of the deposition chamber 41. The inhalant pipe 34' is connected to the projection 21a of the chamber 21, and therefrom it is connected to the valve 35.

The thick film of Au is formed on the substrate 42 in the gas deposition apparatus 1' of the second embodiment under the same conditions as the first embodiment. No aggregates of the particles have been found in this film of Au after deposition continuously for 10 hours. The shearing force of this film is equal to 20 kgf/mm², also.

While the preferred embodiments of the invention have been described, variations will be possible on the basic concept of this invention.

For example, in the heating method of the above embodiments, the transfer pipe 31 is heated by applying DC voltage to the transfer pipe 31 which is used as a resistor. For the transfer pipe 31, another heating method may be used. For example, the seethe heater may be wound on the transfer pipe 31.

Further, in the above embodiments, the transfer pipe 31 is inclined to adjust the relative position of the carbon crucible 22 to the inlet port 31a of the transfer pipe 31. Instead, the carbon crucible 22 with the coil 23 may be moved relative to the fixed transfer pipe 31 to adjust the relative position between the inlet port 31a of the transfer pipe 31 and the carbon crucible 22.

Further, in the above embodiment, the transfer pipe 31 is straight. But, it may be curved to the extent that the flow of the helium gas including the ultra fine particles is not disturbed.

Further, in the above embodiment, Au is used as material for the ultra fine particles. Other metal for instance, Ag (silver) or Cu (copper), may be used, and the same effect can be obtained.

Furthermore, in the above embodiment, a helium gas is used as the inert gas. Other inert gas, for instance, Ne (neon) or Ar (argon), can be used.

What is claimed is:

1. In a method for operating a gas deposition apparatus in which ultra fine particles selected from the group consisting of organic and inorganic materials are formed in an evaporation chamber, carried with inert gas through a transfer pipe and nozzle to a deposition chamber, and ejected from said nozzle for deposit on a substrate located in the deposition chamber to form a film or condensate on the substrate, the improvement comprising the steps of providing heating means for said transfer pipe, heating said transfer pipe to a temperature less than the gasification temperature for said particles, forming said particles in said evaporation chamber, carrying the particles with inert gas through the transfer pipe whereby the particles are prevented from adhering and coagulating on said transfer pipe and nozzle, and depositing the particles on said substrate without aggregations of said particles scattering into said film or condensate on said substrate.

2. A method according to claim 1 wherein said ultra fine particles are selected from the group consisting of gold, silver and copper particles.

3. A method according to claim 1 including the step of also heating said nozzle to a temperature less than the gasification temperature for said particles.

* * * * *